United States Patent [19]

Asai et al.

[11] Patent Number: 4,521,476
[45] Date of Patent: Jun. 4, 1985

[54] HYBRID INTEGRATED CIRCUIT AND PREPARATION THEREOF

[75] Inventors: Shinichiro Asai; Kazuo Katoh; Tatsuo Nakano, all of Machida, Japan

[73] Assignee: Denki Kagaku Kogyo Kabushiki Kaisha, Tokyo, Japan

[21] Appl. No.: 506,589

[22] Filed: Jun. 22, 1983

[30] Foreign Application Priority Data

Aug. 19, 1982 [JP] Japan .................... 57-142726

[51] Int. Cl.³ .............. B32B 3/00; C23B 1/08; H01L 27/10
[52] U.S. Cl. ................................ 428/209; 428/901; 428/699; 428/607; 428/652; 428/674; 174/68.5
[58] Field of Search ........... 428/901, 209, 699, 607, 428/652, 674; 174/68.5

[56] References Cited

U.S. PATENT DOCUMENTS

| | | | |
|---|---|---|---|
| 3,791,858 | 2/1974 | McPherson et al. | 174/68.5 X |
| 3,801,388 | 4/1974 | Akiyama et al. | 174/68.5 X |
| 3,967,371 | 7/1976 | Croset et al. | 174/68.5 X |
| 3,983,284 | 9/1976 | Croset | 428/901 X |
| 4,190,474 | 2/1980 | Berdan et al. | 428/901 X |
| 4,404,059 | 9/1983 | Livshits et al. | 174/68.5 X |

FOREIGN PATENT DOCUMENTS 36502  2/1977  Japan .................... 428/901

Primary Examiner—George F. Lesmes
Assistant Examiner—Nancy A. B. Swisher
Attorney, Agent, or Firm—Oblon, Fisher, Spivak, McClelland & Maier

[57] ABSTRACT

A hybrid integrated circuit is prepared by laminating an aluminum-copper clad foil on an insulating layer, etching the aluminum-copper clad foil with etching agents to form an aluminum circuit and a copper circuit and connecting a semiconductor element to the aluminum circuit through an aluminum wire or a gold wire while connecting a circuit element to the copper circuit by soldering.

7 Claims, 9 Drawing Figures

HYBRID INTEGRATED CIRCUIT AND PREPARATION THEREOF

The present invention relates to a hybrid integrated circuit which allows both connection of a semiconductor element to a circuit portion through an aluminum wire or a gold wire and connection of an external lead terminal, a semiconductor element and other circuit elements to another circuit portion by soldering in the circuit which are formed by performing a selective etching treatment of a different kind of first and second conductive metals such as aluminum and copper laminated on a common substrate to expose the surfaces of the metals.

The conventional hybrid integrated circuit has been prepared by forming a circuit on a substrate made of glass or ceramic material by way of printing or evaporation, or by forming a circuit by etching a copper-laminated substrate which is formed by laminating an insulating layer and a copper foil on a base plate made of aluminum or iron, followed by connecting circuit elements to the circuit by soldering. Generally, there has been carried out on a circuit connecting operations such as die bonding of semiconductors, connection of external lead wires, attachment of chip elements e.g. chip capacitors, chip resistors etc. and connection of semiconductors with the circuit through a gold wire or an aluminum wire.

With respect to a portion on the substrate connected with the gold wire or the aluminum wire, there have been various proposals of treatment such as plating of a noble metal such as gold or silver, nickel plating (Japanese Examined Publication No. 3461/1977), aluminum evaporation plating (Japanese Unexamined Publication No: 28662/1976) and metal pellet bonding (Japanese Examined Publication No. 37110/1970). However, when a plating treatment is employed, it is necessary to install an equipment for the plating treatment and in addition, is necessary to carefully control the fineness of the surface and the thickness of the plated layer. On the other hand, when a metal pellet is used, the number of bonding operations is greater than the number of die bonding for the semiconductors with the result that the bonding operations become complicated.

In a case of carrying out wire bonding operation by applying a ultrasonic vibration to an aluminum wire, if a copper exposure circuit is formed on a high polymeric resin insulating layer, there occurs a so-called escaping of ultrasonic wave because the insulating layer possesses a low Young's modulus thereby precluding to obtain a satisfactory bonding. On the other hand, in the noble metal plating method or the nickel plating method, the fineness of the surface of portions to be bonded is strictly required and furthermore, the condition for bonding under the application of a ultrasonic vibration is limited to a narrow range.

It is an object of the present invention to overcome the disadvantage of the conventional method and to provide a process for preparing a hybrid integrated circuit which allows both connection of semiconductor elements to a circuit portion through an aluminum wire or a gold wire and connection of the elements to another circuit portion by soldering.

These and the other objects of the present invention have been attained by providing a process for preparing a hybrid integrated circuit comprising laminating an aluminum-copper clad foil on an insulating layer with or without a laminated metal substrate, etching said aluminum-copper clad foil with etching agents to form an aluminum circuit and a copper circuit and connecting a semiconductor element to said aluminum circuit through an aluminum wire or a gold wire while connecting a circuit elements to said copper circuit by soldering.

As an aspect of the present invention, there is provided a hybrid integrated circuit prepared by the above mentioned process.

The foregoing objects of the hybrid integrated circuit according to the present invention will become apparent and understandable from the following description thereof, when read in connection with an example thereof as well as the accompanying drawing.

Figure 1:
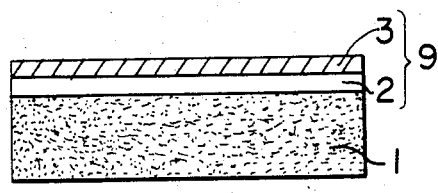
FIGS. 1 to 3 are sectional views, shown as a model, of an embodiment of the circuit substrate of the present invention showing steps of forming a circuit.

An embodiment of the present invention will be described with reference to FIGS. 1 to 4.

A circuit substrate is made up by bonding a conductive metal layer 9 composed of two laminated metal foils such as aluminum foil 2 as a lower layer and a copper foil 3 as an upper layer on an insulating layer 1 which may be a supporting body. The circuit substrate thus prepared is subjected to an etching treatment with an etching agent for dissolving only the upper metal layer and another etching agent for dissolving only the lower metal layer to expose each of the metal layers into a predetermined circuit pattern whereby a circuit substrate for a hybrid integrated circiut is formed. Then, semiconductor elements are connected to an aluminum circuit formed of an aluminum conductive path through an aluminum wire or a gold wire by applying a ultrasonic vibration and circuit elements are connected to a copper circuit formed of a copper conductive path by soldering. As an alternative embodiment, a conductive metal layer 9 may be composed of an upper aluminum as an upper layer and a lower copper foil as a lower layer.

FIGS. 5 to 8 show another embodiment of the present invention. A conductive metal layer 9 composed of an aluminum foil 2 as an upper layer and a copper foil 3 as a lower layer is attached on a metal supporting body 8 through an insulating layer 1. The conductive metal layer 9 may be formed of a copper foil 3 as an upper layer and an aluminum foil 2 as a lower layer.

The insulating layer 1 used in the present invention may be of an organic polymer such as epoxy resin, phenol resin, silicon resin, polyimide resin etc., an inorganic material or a composite material composed of an inorganic material and an organic polymer such as glass-epoxy. It is particularly desirable to use a composite material composed of an organic polymer and an inorganic powder having an excellent heat conductivity such as beryllia, boron nitride, alumina, magnesia, silica etc. which is incorporated at an amount greater than the organic polymer, because it has a high heat conductivity and inhibits to occur a phenomenon of the escaping of a ultrasonic wave.

A circuit substrate formed of combination of the insulating layer composed of the composite material above mentioned and a metallic base plate provides a further excellent heat conductivity. It is optimum as a circuit substrate for a high power hybrid integrated circuit.

The aluminum foil and the copper foil have respectively a thickness of 0.1 μm to 100 μm. The laminated aluminum-copper clad foil may be formed by superposing both the foils or by forming a copper layer on the aluminum foil by plating or by forming zinc and copper layers on the aluminum foil by plating in this order.

A circuit forming operation for the hybrid integrating circuit of the present invention will be described.

Figure 2:
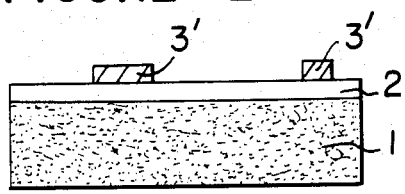

A resist is screen-printed on the laminated aluminum-copper clad foil 9 followed by drying. The first metal layer 3 of the upper part of the clad foil 9 is subjected to an etching treatment with a selective etching agent to obtain a predetermined circuit pattern (FIG. 2). Then the resist is removed. If necessary, the resist may be left to carry out the next step.

Figure 3:
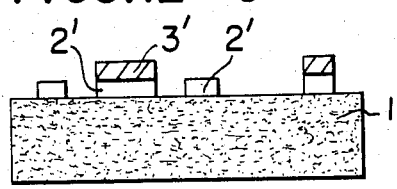
Figure 7:
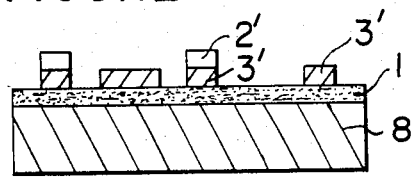

A resist is again screen-printed on the circuit substrate and is dried. An etching agent for etching only the second metal layer 2 of the lower part of the clad foil 9 is applied to the circuit substrate to obtain a predetermined circuit pattern for the second metal layer. Thus, a circuit is formed on the circuit substrate (FIGS. 3 and 7).

On the circuit substrate, a copper circuit 3' is used to connect circuit elements by soldering and an aluminum circuit 2' is for bonding an aluminum wire or a gold wire 6.

Figure 4:
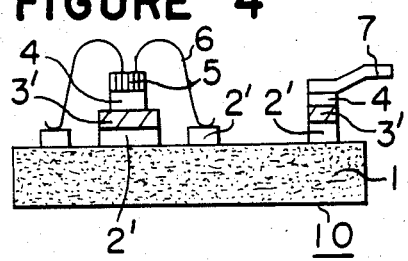
FIG. 4 is a sectional view of an embodiment of a circuit formed on the circuit substrate shown in FIGS. 1 to 3.
Figure 5:
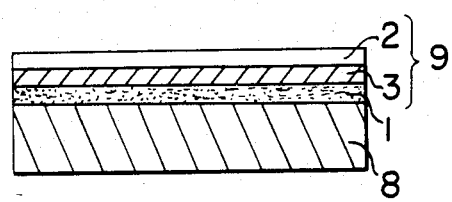
FIGS. 5 to 7 are sectional views, shown as a model, of another embodiment of the circuit substrate of the present invention showing steps of forming a circuit.
Figure 8:
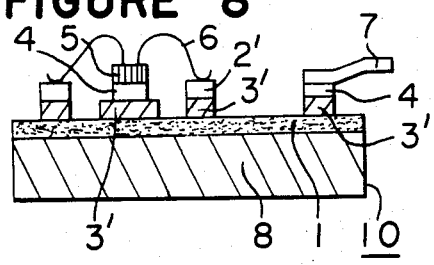
FIG. 8 is a sectional view of the circuit substrate shown in FIGS. 5 to 7, fitted with circuit elements.

FIGS. 4 and 8 show circuit substrates provided with a semiconductor device 5 and an external lead terminal 7. The semiconductor device 5 and the external lead terminal 7 are connected to the copper circuit 3' through a solder layer 4 and the semiconductor device 5 is electrically connected to the aluminum circuit 2' through the aluminum wire or the gold wire 6. The external lead terminal 7 may be connected to the copper circuit 3' by means of a conductive adhesive instead of the solder layer 4 or connected to the copper circuit 3' through a heat sink such as a copper plate by soldering.

In the embodiments described above, the first and second metal layers are subsequently etched using an etching agent for etching only the first metal layer and another etching agent for etching only the second metal layer to form the respective predetermined circuit patterns. It is possible to obtain predetermined circuit patterns by etching both of the first and second metal layers with use of an etching agent such as ferric chloride and then by etching only the first metal layer with use of an etching agent having a selective etching property for the first metal layer.

In the circuit substrate in the embodiments of the present invention, either aluminum or copper may be exposed in a circuit, if that portion is not required for soldering of the circuit elements or wire bonding of the aluminum wire or the gold wire 6.

An etching agent having selectivity with respect to copper, that is, an etching agent which etches copper but does not etch aluminum can be sulfuric acid-hydrogen peroxide type etching agent (For instance, PERMA ETCH produced by Ebara Densan Kabushiki Ksiaha), the aqueous solution of persulfate such as ammonium persulfate, sodium persulfate, etc., and so forth. The etching agents specified above are advantageous because it is unnecessary to use a film for protecting the reverse surface of the metal supporting body 8 shown in FIG. 8 when an aluminum plate is used as the supporting body.

As an etching agent having selectivity with respect to aluminum, that is, an etching agent which etches aluminum but does not etch copper, an agent obtained by dissolving nitrate such as sodium nitrate or nitride such as sodium nitrite in the aqueous solution of inorganic strong base such as sodium hydroxide, potassium hydroxide and so forth is preferably used because it minimizes generation of hydrogen and provides excellent etching property. An anticlinker agent and a chelating agent for aluminum may be added, if desired.

Preferred embodiments of the present invention will be described.

EXAMPLE 1

As shown in FIG. 1, a glass-epoxy insulating supporting plate 1 having a thickness of 1.6 mm was prepared and an aluminum-copper clad foil 9 composed of an aluminum foil 2 having a thickness of 15 μm and a copper foil 3 having a thickness of 35 μm was laminated on the glass-epoxy insulating supporting plate 1 with the surface of the copper foil outside. On the copper foil surface, an etching resist (alkaline removing ink DA-200B produced by SANWA KAGAKU Company) was formed by screen-printing and was dried at 80° C. for 10 minutes. Spray etching was carried out for the copper foil surface with PERMA ETCH (tradename, Ebara Densan Kabushiki Kaisha) as a selective etching agent for copper, at 54° C. for 2 minutes, followed by washing it with 2% aqueous solution of sodium hydroxide to remove the etching resist with result that copper circuit 3' was formed.

An etching resist having durability to strong base (MR-500 produced by Asahi Kaken Company) was screen-printed on the substrate having the copper circuit 3' and dried at 100° C. for 10 minutes. The substrate was sprayed with the aqueous solution of the strong base consisting of 100 g/l of sodium hydroxide and 2 g/l of potassium hydroxide at 50° C. for 3 minutes with the result that a citcuit substrate 10 having the copper circuit 3' and the aluminum circuit 2' as shown in FIG. 3 was obtained.

EXAMPLE 2

An aluminum-copper clad foil 9 same as in FIG. 1 was prepared. The surface of the copper foil was coated with inorganic powder filled epoxy resin (RAMDITE manufactured by Denki Kagaku Kogyo Kabushiki Kaisha) at a thickness of 100 μm. On the coated layer, an aluminum plate 8 having a thickness of 2 mm was laminated and was cured at a room temperature under a pressure to obtain a supporting substrate having an insulating layer 1.

Figure 6:
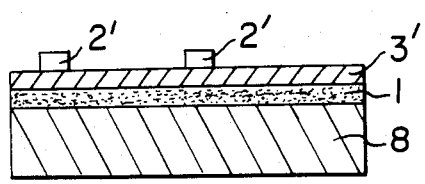

On the reverse surface of the supporting substrate, a protective film of vinyl chloride resin was laminated. An etching resist was screen-printed on the aluminum layer and etching treatment for aluminum layer as described in Example 1 was carried out to obtain an aluminum circuit as shown in FIG. 6.

A selective etching agent for copper was prepared by incorporating a small amount of TEC H (produced by Tokai Denka K.K.) as an etching acceleration agent into an aqueous solution of ammonium persulfate of 150 g/l and the copper layer was subjected to an etching treatment at 40° C. for 2 minutes to obtain a circuit substrate 10 having the aluminum circuit 2' and the copper circuit 3' as shown in FIG. 7.

COMPARATIVE EXAMPLE

Figure 9:
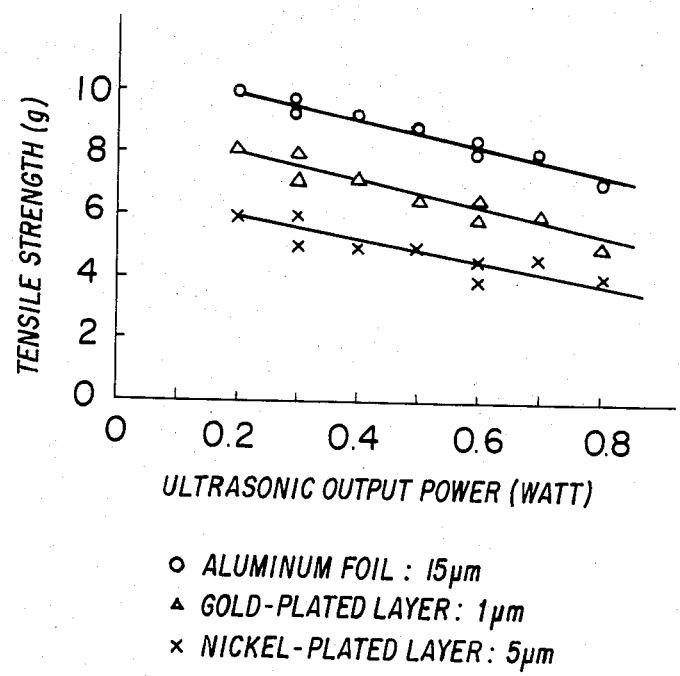
FIG. 9 is a diagram showing relationship of output power at the time of wire bonding under a ultrasonic vibration to tensile strength.

The following three test works were prepared: a circuit substrate 10 obtained by the process according to Example 2 and two circuit substrates laminated with a copper foil having a thickness of 35 μm instead of the aluminum-copper clad foil of Example 2 wherein one was coated with a gold plated layer having a thickness of 1 μm and the other a nickel plated layer of 5 μm. An aluminum wire having a diameter of 30μ is connected to each of test works by ultrasonic wire bonding and wire bonding characteristic for each work was examined. The result is shown in FIG. 9 (Wire bonding was performed using the Wire Bonder USW-5Z60S manufactured by Choonpa Kogyo Company). In FIG. 9, the ordinate represents tensile strength of the aluminum wire and the abscissa represents ultrasonic output power. It is evident from the figure that the circuit substrate having a bonding pad of a 15 μm thick aluminum foil prepared according to the present invention has a tensile strength higher than others having bonding pad formed by plating and is small in fluctuation of values of the tensile strength. The fact that the tensile strength values largely fluctuate in the case of plating treatment means that condition of the surface of a metal layer formed by plating highly affects the wire bonding characteristic. Thus, the bonding pad formed by plating has an avoidable drawback.

An additional test on the wire bonding characteristic was carried out using the circuit substrate with an aluminum layer coated with goldplated layer as used in Comparative Example and the circuit substrate with an aluminum layer as prepared in Example 2, each provided with a gold wire having a diameter of 25μ connected by ultrasonic wire bonding. NTC Manual Bonder WA1472 (manufactured by Kaijo Denki Company) was used and the wire bonding was carried out under application of both pressure and ultrasonic wave at 250° C. The tensile strengths of both the test works were about 5 grams and the tensile strength tests terminated in breaking of wires. It is understood that wire bonding characteristic is sufficiently enough even in a case that a gold wire is connected by wire bonding on the bonding pad of the aluminum foil having a thickness of 15 μm which is prepared according to the present invention.

As described above, in accordance with the present invention, a novel hybrid integrated circuit can be formed by exposing desired portions of the surfaces of both copper and aluminum by performing twice selective etching treatment of an aluminum-copper clad foil laminated on an insulating layer and both connection of an aluminum wire or a gold wire to the circuit and connection of circuit elements to the circuit can be attained.

We claim:
1. A hybrid integrated circuit, comprising:
an aluminum-copper clad foil on an insulating layer, wherein the upper metal foil of said aluminum-copper clad foil is etched into a predetermined circuit pattern by an etching agent which selectivity dissolves only the metal of said upper metal foil and then the lower metal foil is etched into a predetermined circuit pattern by an etching agent which selectivity dissolves only the metal of said lower metal foil, thereby forming a device having an aluminum circuit pattern and a copper circuit pattern, a semiconductor element connected to said aluminum circuit through an aluminum wire or a gold wire and a circuit element soldered to said copper circuit.

2. The hybrid integrated circuit of claim 1, wherein said insulating layer is provided with a laminated metal substrate.

3. The hybrid integrated circuit of claim 1, wherein said copper foil of said aluminum-copper clad foil is attached to said insulating layer.

4. The hybrid integrated circuit of claim 1, wherein said aluminum foil of said aluminum-copper clad foil is attached to said insulating layer.

5. The hybrid integrated circuit of claim 1, wherein each of the laminated copper and aluminum foils has a thickness ranging from 0.1 μm to 100 μm.

6. The hybrid integrated circuit of claim 1, wherein said insulating layer is formed of an organic polymer selected from the group consisting of epoxy resins, phenol resins, silicone resins and polyimide resins.

7. The hybrid integrated circuit of claim 1, wherein said insulating layer is an inorganic material or a composite material formed from an inorganic material and an organic polymer.

* * * * *